United States Patent [19]
Paul

[11] Patent Number: 5,398,157
[45] Date of Patent: Mar. 14, 1995

[54] SNAP-IN MOUNTING BRACKET FOR A COMPUTER MEMORY DEVICE

[75] Inventor: Dieter G. Paul, Anaheim, Calif.

[73] Assignee: Kingston Technology Corporation, Fountain Valley, Calif.

[21] Appl. No.: 47,656

[22] Filed: Apr. 13, 1993

[51] Int. Cl.[6] .................. H05K 7/12; A47B 96/06; G06F 1/16
[52] U.S. Cl. ..................... 361/684; 361/732; 361/740; 361/759; 361/809; 248/222.1
[58] Field of Search .............. 248/222.1, 224.4, 681; 364/708.1; 360/97.01, 98.01, 137; 361/683–685, 732, 740, 759, 807, 809, 810, 825

[56] References Cited

U.S. PATENT DOCUMENTS

| | | |
|---|---|---|
| 4,568,988 | 2/1986 | McGinlay et al. |
| 4,639,863 | 1/1987 | Harrison et al. |
| 4,971,281 | 11/1990 | Steinbeck ............ 248/222.1 X |
| 5,062,016 | 10/1991 | Zupancic. |
| 5,264,975 | 11/1993 | Bajorek et al. ............ 360/97.01 |

FOREIGN PATENT DOCUMENTS

| | | | |
|---|---|---|---|
| 3-240299 | 10/1991 | Japan | 361/685 |
| 4-64112 | 2/1992 | Japan | G06F 1/16 |

Primary Examiner—Michael W. Phillips
Attorney, Agent, or Firm—Hawes & Fischer

[57] ABSTRACT

A mounting bracket is disclosed, a pair of which are affixed at opposite sides of a conventional computer memory device (e.g. a hard disk drive system). The mounting brackets detachably connect the memory device to a removable computer circuit card by way of slots formed through the card. The brackets have legs which are received through the slots to engage the circuit card and thereby prevent the detachment of the memory device. Blocking arms of the mounting brackets are received through respective slots to prevent the disengagement of the legs of the brackets from the circuit card. A blocking arm and a leg are engaged in a single slot. The blocking arms may be rotated out of the slots to then permit the disengagement of the bracket legs from the circuit card so that the memory device may be disconnected from the card.

8 Claims, 3 Drawing Sheets

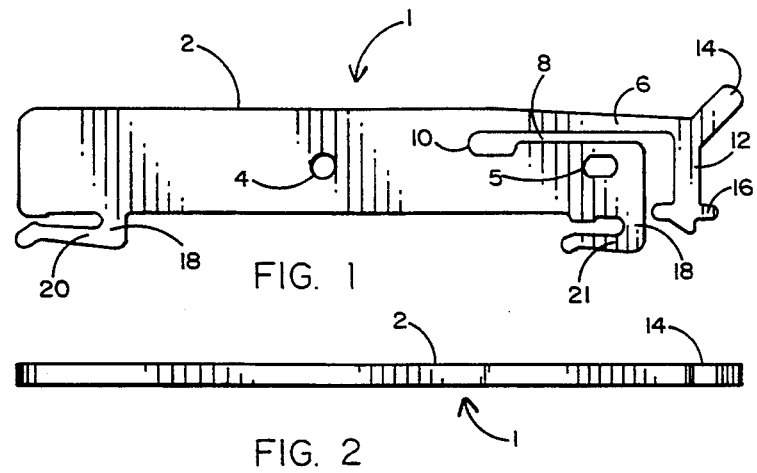
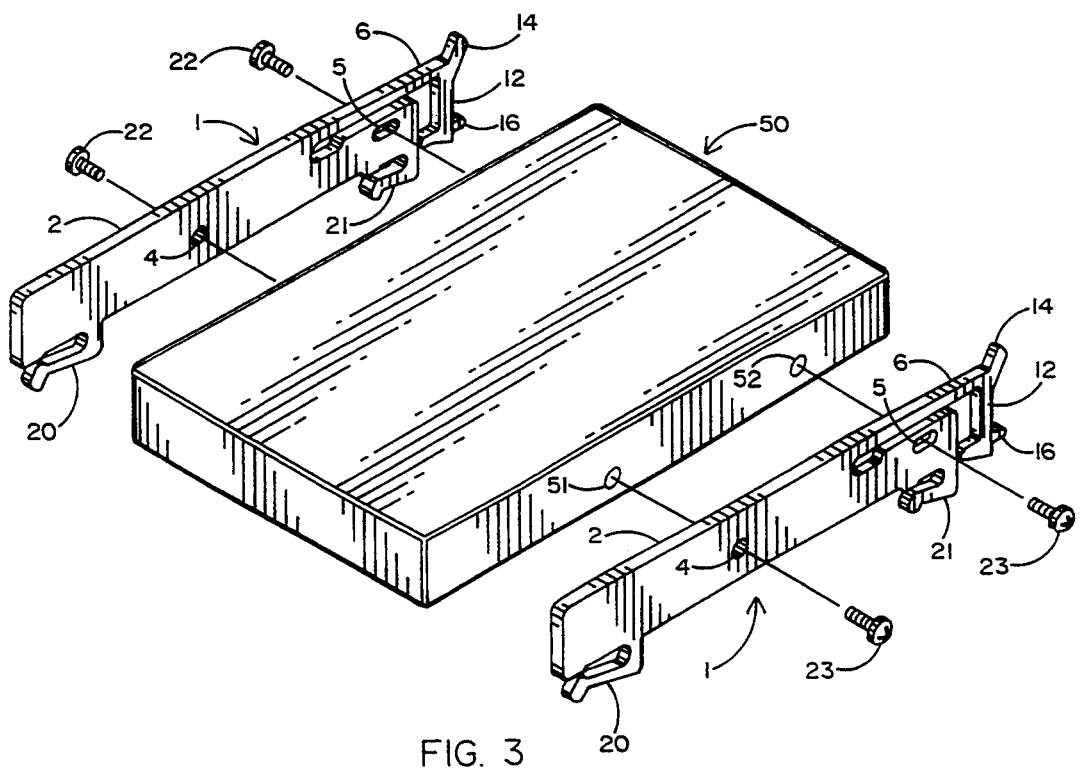

SNAP-IN MOUNTING BRACKET FOR A COMPUTER MEMORY DEVICE

BACKGROUND OF THE INVENTION

1. Field of the Invention

This invention relates to a mounting bracket, a pair of which are affixed at opposite sides of a conventional computer memory device (e.g. a hard disk drive system), to enable the memory device to be reliably and detachably mounted upon a removable computer circuit card which carries the electronics necessary for controlling the operation of the memory device and interfacing the device with the computer hardware.

2. Background Art

It is common for portable computers to include an internal memory which is fixed within the computer housing. One such conventional memory device is a hard disk drive system which, by virtue of its small size, storage capacity and vibration isolation, is ideal for many personal computing applications. In some cases, it may be necessary to repair or replace the disk drive system. However, it is generally a labor intensive task to gain access to and physically remove the disk drive system for inspection. In other cases, it may be desirable to repair or replace the electronics which control the operation, data transfer and addressing of the disk drive system. This too may prove to be a labor intensive task. Consequently, and in these cases, a repair or replacement of the disk drive system or its electronics will often necessitate that the computer be transported to a remote repair facility that is capable of making the required changes. The computer down time and costs associated with employing the services of such a repair facility contribute to inefficient computer use.

It would therefore be desirable to easily and detachably mount a computer memory device (e.g. a hard disk drive system) on a removable carrier, such as a circuit card, or the like, which contains the electronics necessary for the control, data transfer and addressing of the device. In this way, the repair or replacement of the memory device and/or its control/interface electronics can be quickly and efficiently accomplished without having to transport the computer to a remote location by simply removing the old circuit card and either installing an altogether new card or returning the old card with a new disk drive system mounted thereon.

Examples of computer disk drive systems which are carried on electronic circuit cards are available by referring to the following U.S. Pat. Nos.:
4,568,988 Feb. 14, 1986
4,639,863 Jan. 27, 1987
5,062,016 Oct. 29, 1991

SUMMARY OF THE INVENTION

In general terms, a mounting bracket is disclosed to facilitate the detachable connection of a conventional computer memory device, such as a hard disk drive system, to a carrier, such as an integrated circuit card, which carries the electronics that control the operation, data transfer and addressing of the memory device. When a repair or replacement is necessary, the carrier can be quickly and easily removed from the computer with the memory device mounted thereon. This advantageously avoids the necessity common to computers having a fixed internal memory device of having to transport the computer to a remote facility at which a relatively large amount of time would typically be spent to gain access to and remove the memory device and/or its control/interface electronics.

The mounting bracket of the present invention includes an elongated body having a flexible release arm hingedly attached thereto. A blocking tab is formed at the bottom of the release arm. Depending downwardly from the body of the bracket is a pair of axially spaced legs, each leg having a locking clip which turns under the body. A mounting bracket is attached to each side of the memory device by way of holes formed in the body that align with existing screw holes formed in the memory device.

In operation, the memory device is moved towards the circuit card so that the locking clips of the mounting brackets are received through respective slots formed in the card. The memory device is then pushed in a first direction relative to the circuit card from an unlocked position to a locked position until the card is received within the space between the body and the locking clips of the mounting brackets and the blocking tabs snap into slots occupied by adjacent clips. Accordingly, the locking clips prevent the memory device from being pulled upwardly and off the circuit card, and the blocking tabs prevent the memory device from being pushed in an opposite direction towards the unlocked position. To detach the memory device from the circuit card, the release arms are pivoted at their hinges to correspondingly rotate the blocking tabs out of their slots. The memory device is then moved relative to the circuit card from the locked position to the unlocked position where the locking clips are aligned to be retracted from their slots in the card. The memory device may now be easily lifted off and disconnected from the card for repair or replacement.

BRIEF DESCRIPTION OF THE DRAWINGS

FIG. 1 is a side view of the mounting bracket which forms the present invention;

FIG. 2 is a top view of the mounting bracket of FIG. 1;

FIG. 3 shows a pair of mounting brackets of FIG. 1 attached to opposite sides of a computer memory device;

DETAILED DESCRIPTION

Figure 4:
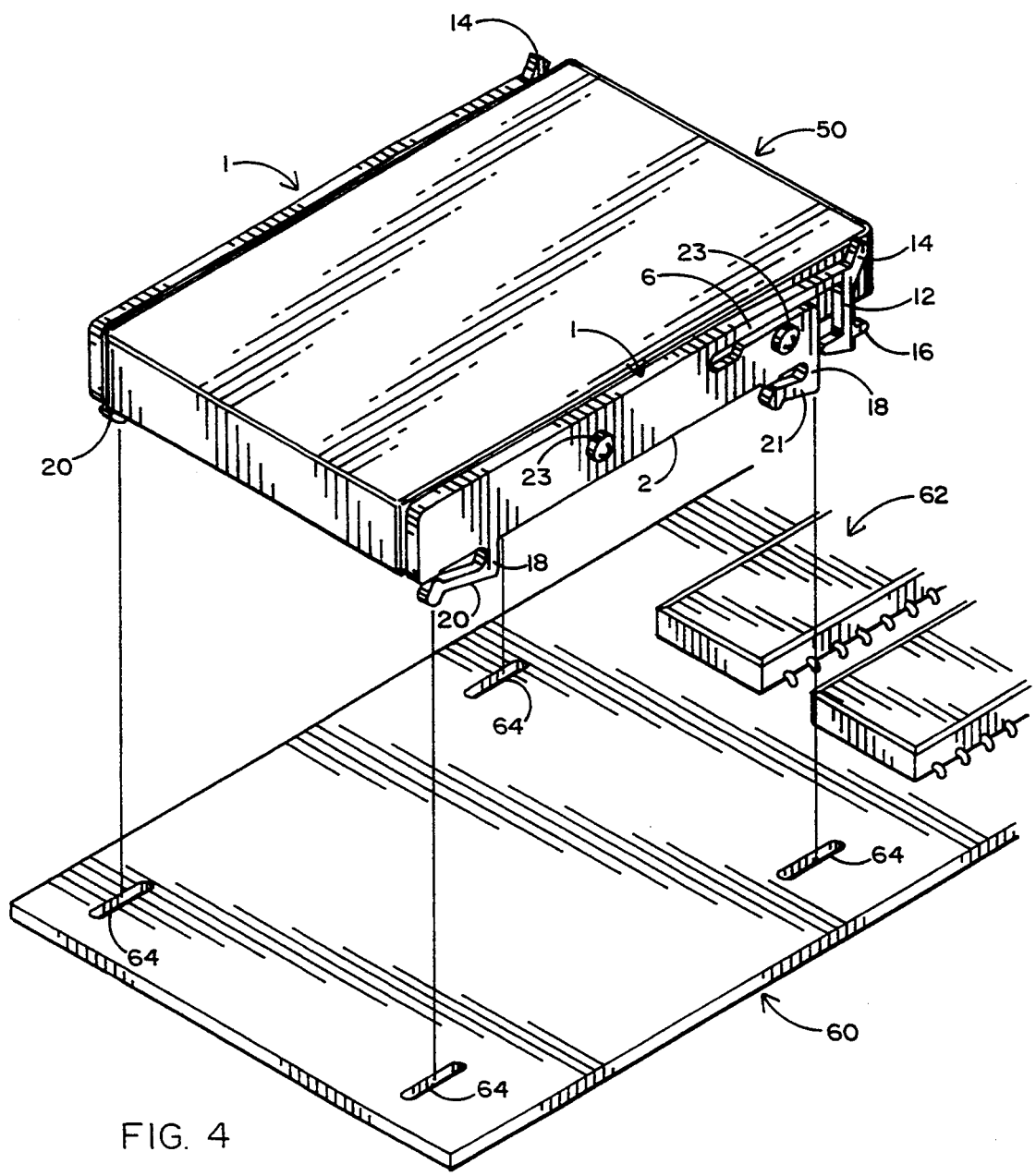
FIG. 4 shows the memory device of FIG. 3 suspended above a computer circuit card to be detachably mounted at slots formed therein.
Figure 5:
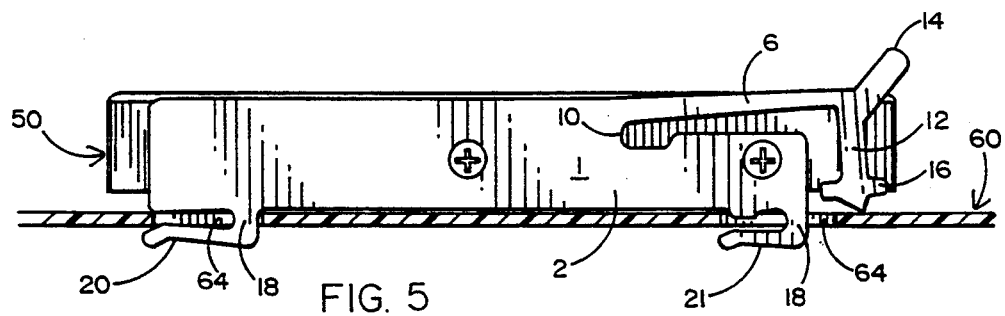
FIGS. 5-7 illustrate the steps by which the memory device of FIG. 4 is detachably mounted to the circuit card.

The mounting bracket 1 which forms the present invention is initially described while referring to FIGS. 1 and 2 of the drawings. Mounting bracket 1 is preferably formed (e.g. molded) from a single piece of flexible material, such as plastic, or the like. However, the material from which bracket 1 is manufactured is not to be regarded as a limitation of this invention. The mounting bracket 1 includes an elongated, generally rectangular body 2 having a pair of attachment holes 4 and 5 formed therethrough. As will be explained in greater detail when referring to FIG. 3, the attachment holes 4 and 5 of bracket 1 are aligned with existing screw holes in a computer memory device to enable the bracket to be easily affixed to such memory device without making any alterations thereto.

Projecting from and aligned parallel with the longitudinal axis of the elongated body 2 of mounting bracket 1 is a release arm 6. Release arm 6 is integrally formed with body 2 such that a longitudinally extending gap 8 is established therebetween. In this manner, the release arm 6 is cantilevered to the body of bracket 1 at a hinge 10 around which the arm 6 is adapted to pivot. Projecting downwardly and in generally perpendicular alignment from the release arm 6 is a finger 12. An outwardly extending finger ledge 14 is coextensively formed at the intersection of release arm 6 with a first end of finger 12. A relatively wide blocking tab 16 is formed at the opposite end of finger 12. As will be disclosed in greater detail hereinafter, the application of a manual pushing force to the finger ledge 14 will cause the release arm to rotate at its hinge 10 so as to correspondingly cause finger 12 and the blocking tab 12 thereof to also rotate when it is desirable to remove the associated memory device from its carrier upon which the memory device is mounted.

Depending downwardly from the body 2 of mounting bracket 1 is a pair of axially spaced legs 18. Coextensively connected to each of the legs 18 is a respective locking clip 20 and 21. The locking clips 20 and 21 bend away from the legs 18 so as to extend in the same direction with one another and in generally spaced, parallel alignment with the bottom edge of the body 2 of mounting bracket 1. One of the locking clips 21 lies adjacent but slightly below the blocking tab 16 of finger 12.

FIG. 3 of the drawings shows the means by which a pair of identical brackets 1 as just described when referring to FIGS. 1 and 2 are affixed to a computer memory device 50. The memory device 50 illustrated in the drawings is a conventional hard disk drive system for use in a portable computer and similar computing devices. The hard disk drive memory system 50 is commercially available from a variety of manufacturers and forms no part of the present invention. Moreover, while a hard disk drive system 50 is shown and described, this is not to be regarded as a limitation of this invention, and it is to be expressly understood that mounting bracket 1 may also be affixed to other conventional computer memory devices (e.g. a tape drive, and the like).

In the case of the illustrated hard disk drive memory system 50, a pair of existing screw holes 51 and 52 are shown at each of the opposite sides thereof. The body 2 of a mounting bracket 1 is positioned adjacent a respective side of the memory device 50 such that the attachment holes 4 and 5 in body 2 are aligned with existing screw holes 51 and 52 in device 50. Suitable fasteners (e.g. screws 23) are then inserted through each pair of aligned holes 4, 51 and 5, 52 in order to affix the mounting brackets 1 at the opposite sides of memory device 50. Of course, the brackets 1 may be detached from memory device 50 by simply removing the fasteners 23 therefrom.

The method for detachably mounting the memory device 50 having mounting brackets 1 at opposite sides thereof to a carrier is described while referring concurrently to FIGS. 4-7 of the drawings. By way of example, the carrier that will be described herein is a flat computer circuit card 60 of the type having a plurality of conventional integrated circuits (e.g. packaged within modules 62 of FIG. 4) that are electrically interconnected with each other and with memory device 60 to control the operation and use of the memory device. Moreover, the circuit card 60 as shown in FIG. 4 is adapted to be removably received within an expansion slot of the typical portable computer such that the combination memory device 50 and circuit card 60 has the attributes of a computer peripheral. However, it is to be understood that memory device 50 may be mounted on carriers other than a printed circuit card 60 including, but not limited to, a chassis (not shown).

In the present example, a pair of spaced axially aligned slots 64 are formed along each side of the printed circuit card 60. The location of and distance between each of the slots 64 through circuit card 60 is predetermined to correspond with the location and distance between the locking clips 20 and 21 of mounting brackets 1. In this regard, the memory device 50 is suspended above the circuit card 60 such that the locking clips 20 and 21 of the pair of mounting brackets 1 will register with the slots 64 therebelow (best shown in FIG. 4). Accordingly, when the memory device 50 is moved towards and flush against the face of circuit card 60, each of the legs 8 and locking clips 20 and 21 of the mounting brackets 1 will be received downwardly through a respective slot 64 in card 60 (best shown in FIG. 5). However, the locking tab 16 of each bracket 1 is initially located atop circuit board 60. and outside its adjacent slot 64. Thus, memory device 50 is in the unlocked position relative to circuit card 60.

Figure 6:
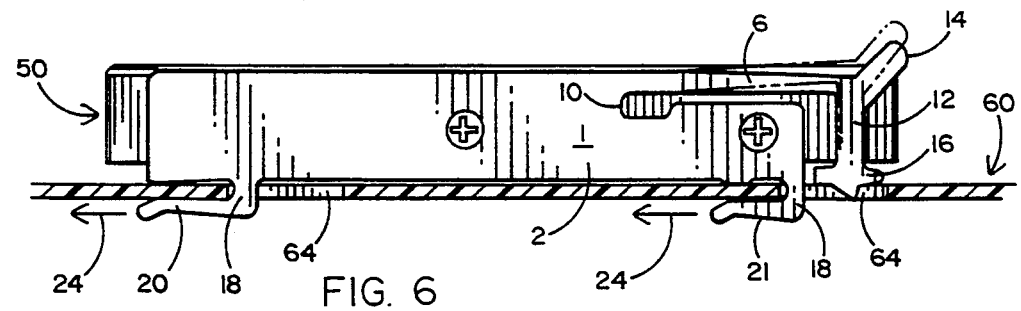

Next, and referring to FIG. 6 of the drawings, an axial pushing force is applied to the memory device 50, whereby to cause the memory device 50 and the mounting brackets 1 affixed thereto to slide along the face of the circuit card 60 towards the locked position. Accordingly, the legs 18 of each mounting bracket 1 correspondingly slide through their respective slots 64 (in the direction of the reference arrows 24) until the circuit card 60 is received in the spaces between the bottom of the housing and the locking clips 20 and 21 of brackets 1. That is, as was previously disclosed, a pair of legs 18 depend downwardly from the body 2 of each mounting bracket 1 so that the locking clips 20 and 21 which bend away from the legs are spaced from body 2. The receipt of the circuit card 60 within the space between the body 2 and clips 20 and 21 of bracket 1 prevents the memory device 50 from being inadvertently pulled upwardly and out of electrical contact with the circuit card 60 during handling and transport or as a consequence of being subjected to mechanical vibrations.

What is more, when the legs 18 of mounting brackets 1 slide through slots 64 to the locked position, each blocking tab 16 which was supported by a finger 12 and release arm 6 atop circuit card 60 (in FIG. 5) will now be received adjacent locking clip 21 within a corresponding slot 64 in circuit card 60. More particularly, and referring once again to the unlocked position of FIG. 5, the circuit card 60 is shown pushing upwardly on a blocking tab 16. This upward pushing force is transferred from tab 16 to release arm 6 via finger 12, whereby to cause arm 6 to rotate upwardly and in a counter-clockwise direction at its hinge 10. In this case, the release arm 6 will be stressed like a compressed spring so as to store potential energy.

Referring once again to FIG. 6, when the blocking tab 16 is moved above a slot 64, the potential energy stored therein will cause the release arm 6 to automatically rotate downwardly in a clockwise direction at hinge 10 from its formerly stressed position (shown in phantom lines) towards its unstressed position (represented by solid lines). Thus, the blocking tab 16 will be correspondingly rotated by finger 12 through slot 64 so as to snap into engagement with the circuit card 60. However, it may be desirable to shorten the length of the locking clip 21 relative to clip 20 to enable the corresponding slot 64 to accommodate both the locking clip 21 and the blocking tab 16 of mounting bracket 1. Moreover, it may also be desirable to make the corresponding slot 64 through which blocking tab 16 and locking clip 21 are received slightly longer than the axially aligned slot 64 which accommodates locking clip 20.

As disclosed when referring to FIG. 6, the receipt of locking clips 20 and 21 within respective slots 64 prevents the memory device 50 in the locked position from being pulled upwardly and off the circuit card 60. It may also be appreciated that the receipt of blocking tabs 16 within slots 64 prevents the memory device 50 from inadvertently sliding to the unlocked position and out of engagement with the circuit card 60. That is to say, and referring now to FIG. 7 of the drawings, in the event that an axial pushing force is applied to memory device 50 which causes the legs 18 of mounting brackets 1 to slide through slots 64 towards the unlocked position (in a direction represented by reference arrow 26), the blocking tabs 16 will also slide through their slot 64 in the same direction. Eventually, the blocking tabs 16 will strike the circuit card 60 at the end of each slot 64 to block any further sliding movement of the legs 18 and thereby prevent the removal of the card 60 from the spaces between the bodies 2 and locking clips 20 and 21 of mounting brackets 1. In this regard, it may be appreciated that the blocking tab 16 and locking clips 20 and 21 cooperate with one another in the locked position of memory device 50 to reliably mount the device to the circuit card 60 while, at the same time, preventing the inadvertent displacement of memory device 50.

Figure 8:
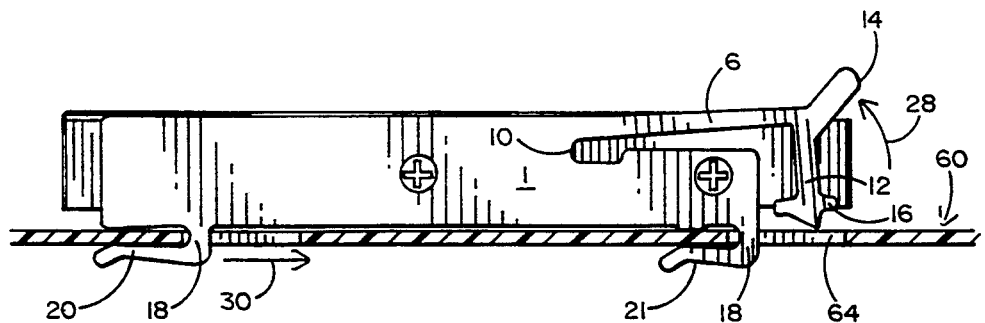
FIG. 8 illustrates the step by which the memory device of FIG. 4 is detached from the circuit card.

FIG. 8 of the drawings illustrates the step by which the release arm 6 of one of the mounting brackets 1 is used to permit the separation and removal of memory device 50 from circuit card 60 when a repair or replacement is necessary. More particularly, a manual pushing force is applied to the underside of finger ledge 14 (in the direction of reference arrow 28) to cause the release arm 6 to correspondingly rotate upwardly and in a counter-clockwise direction at its hinge 10. The upward rotation of release arm 6 is transferred via finger 12 to blocking tab 16. Accordingly, the blocking tab 16 is rotated upwardly and lifted out of its slot 64 in circuit card 60. Although the pushing force 28 is shown in FIG. 8 as being applied to the finger ledge 14 of one mounting bracket 1 affixed to one side of the memory device 50, it is to be understood that an identical force must be simultaneously applied to each of the finger ledges 14 of the mounting brackets 1 affixed at both sides of the memory device.

Figure 7:
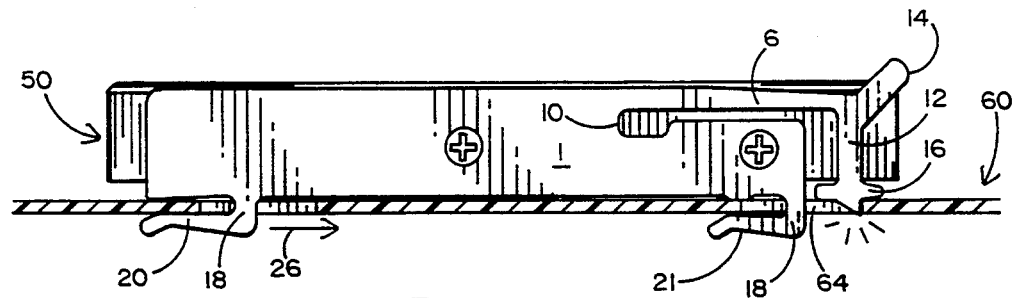

With blocking tabs 16 removed from their slots 64 in card 60, the legs 18 of mounting brackets 1 are now free to slide to the unlocked position (in the direction of reference arrow 30) completely through the slots 64. When the legs 18 are moved back to the unlocked position shown in FIG. 5 (with blocking tabs 16 once again resting upon circuit card 60), the memory device 50 may be grasped so as to be pulled upwardly and off the card 60. In this case, the locking clips 20 and 21 will be retracted upwardly through respective slots 64 to complete the separation of the memory device 50 from circuit card 60. However, by virtue of the mounting bracket 1, such separation cannot occur inadvertently, but requires that a manual force first be applied to the finger ledges 14 in order to selectively rotate blocking tabs 16 out of their blocking position in slots 64 between the locking clips 21 and the circuit card 60 (as shown in FIG. 7).

With memory device 50 detached from circuit card 60, the memory device may be repaired and reattached to the circuit card 60 for return to the computer. In the alternative, an altogether new memory device may be mounted on the circuit card 60 for return to the computer. Additionally, the circuit card 60 may be repaired or replaced by a new card for interconnection with the same or new memory device. In any event, it may be appreciated that by virtue of the mounting bracket of the present invention, the ability to make relatively quick and easy repairs to the memory device and/or the control/interface circuitry thereof is greatly improved relative to those internal memory devices which are fixed and inaccessible within a computer housing.

It will be apparent that while a preferred embodiment of the invention has been shown and described, various modifications and changes may be made without departing from the true spirit and scope of the invention.

Having thus set forth the preferred embodiment, what is claimed is:

1. The combination of a carrier to be installed in a computer, a computer memory device, and a mounting bracket attached to said computer memory device and including means by which to detachably connect said computer memory device to said carrier,
said carrier having at least one slot formed therein, said slot having first and opposite ends, and
said mounting bracket having a body and a first leg depending from said body, said first leg having a first means for releasably engaging said carrier and being movable through the first end of said at least one slot formed in said carrier and into releasable engagement with said carrier, said mounting bracket also having blocking means depending from said body, said blocking means being movable through the opposite end of said at least one slot formed in said carrier at the same time that said first leg is moved through the first end of said slot so as to prevent said leg from being disengaged from said carrier and removed from said slot, said blocking means being pivotally attached to the body of said mounting bracket and adapted to be rotated out of said slot to permit said first leg to be disengaged from said carrier and removed from said slot therein so that the first leg of said mounting bracket can be moved out of said slot and said computer memory device disconnected from said carrier.

2. The combination recited in claim 1, wherein said first means for releasably engaging said carrier comprises a locking clip extending from said first leg in generally spaced parallel alignment with the body of said mounting bracket such that said carrier is received between said body and said locking clip when said first leg is moved through said slot and into releasable mating engagement with said carrier.

3. The combination recited in claim 1, wherein said blocking means has a finger ledge projecting therefrom to receive a manually applied force for causing said blocking means to be rotated out of the slot in said carrier.

4. The combination recited in claim 1, wherein said mounting bracket includes at least one hole to receive a fastener therethrough for attaching said bracket to said memory device.

5. The combination recited in claim 1, wherein said carrier is a circuit card having electronic circuitry to be interconnected to said memory device when said memory device is detachably connected to said carrier.

6. The combination recited in claim 1, wherein said blocking means is pivotally attached to the body of said mounting bracket by a flexible arm extending outwardly from said body.

7. The combination recited in claim 1, wherein the body of said mounting bracket has first and opposite ends with said first leg depending from the first end of said body, said mounting bracket having a second leg depending from the opposite end of said body and said carrier having a second slot formed therein, said second leg having a second means for releasably engaging said carrier and being movable through said second slot formed in said carrier and into releasable engagement with said carrier.

8. The combination recited in claim 7, wherein said second means for releasably engaging said carrier comprises a locking clip extending from said second leg in generally spaced parallel alignment with the body of said mounting bracket such that said carrier is received between said body and said locking clip when said second leg is moved through said second slot and into releasable engagement with said carrier.

* * * * *